US012494382B2

(12) United States Patent
Kang et al.

(10) Patent No.: US 12,494,382 B2
(45) Date of Patent: Dec. 9, 2025

(54) METHOD AND APPARATUS FOR TREATING SUBSTRATE

(71) Applicant: SEMES CO., LTD., Cheonan-si (KR)

(72) Inventors: Ki-Moon Kang, Yongin-si (KR); Hyun Goo Park, Seongnam-si (KR); Hyo Won Yang, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 726 days.

(21) Appl. No.: 17/835,498

(22) Filed: Jun. 8, 2022

(65) Prior Publication Data

US 2023/0402295 A1 Dec. 14, 2023

(51) Int. Cl.
*H01L 21/67* (2006.01)
*C23C 16/44* (2006.01)
*C23C 16/455* (2006.01)

(52) U.S. Cl.
CPC .... *H01L 21/67017* (2013.01); *C23C 16/4412* (2013.01); *C23C 16/45551* (2013.01); *H01L 21/67173* (2013.01)

(58) Field of Classification Search
USPC .......................................................... 118/50
See application file for complete search history.

(56) References Cited

U.S. PATENT DOCUMENTS

| 7,201,936 | B2* | 4/2007 | Schwarm | G05B 19/00 |
| | | | | 427/9 |
| 7,524,532 | B2* | 4/2009 | Jurgensen | H01L 21/68771 |
| | | | | 118/500 |
| 9,027,576 | B2* | 5/2015 | Cho | H01L 21/68785 |
| | | | | 134/184 |
| 11,020,777 | B2* | 6/2021 | Lee | H01L 21/6719 |
| 12,138,670 | B2* | 11/2024 | Choi | H01L 21/02101 |
| 2006/0100824 | A1* | 5/2006 | Moriya | H01J 37/32935 |
| | | | | 702/57 |
| 2012/0027936 | A1* | 2/2012 | Gurary | C23C 16/4412 |
| | | | | 427/248.1 |
| 2016/0121374 | A1* | 5/2016 | Lee | H01L 21/6719 |
| | | | | 134/182 |
| 2017/0159181 | A1* | 6/2017 | Toyoda | C23C 16/4412 |

(Continued)

FOREIGN PATENT DOCUMENTS

| JP | 2013-105777 A | 5/2013 |
| JP | 2013-120944 A | 6/2013 |
| JP | 2018-530921 A | 10/2018 |

(Continued)

*Primary Examiner* — Jethro M. Pence

(74) *Attorney, Agent, or Firm* — Harness, Dickey & Pierce, P.L.C.

(57) ABSTRACT

The inventive concept provides a substrate treating apparatus. The substrate treating apparatus includes a high pressure chamber configured to form a treating space for performing a supercritical treating process therein; a substrate support unit configured to support a substrate at the treating space; a fluid supply unit configured to supply a treating fluid to the treating space; and an exhaust unit configured to exhaust an atmosphere of the treating space, and wherein the fluid supply unit comprises a cover plate opposite to a treating surface of a substrate supported by the substrate support unit, and having a supply hole for supplying the treating fluid to the treating surface.

15 Claims, 14 Drawing Sheets

(56) References Cited

U.S. PATENT DOCUMENTS

2022/0189795 A1\* 6/2022 Lee .................... H01L 21/6719

FOREIGN PATENT DOCUMENTS

| JP | 2018-534770 | A | 11/2018 |
| KR | 10-2009-0017176 | A | 2/2009 |
| KR | 102120493 | B1 | 6/2020 |
| KR | 2020/0088547 | A | 7/2020 |
| KR | 10-2021-0032603 | A | 3/2021 |
| KR | 102232495 | B1 | 3/2021 |
| KR | 102297374 | B1 | 9/2021 |

\* cited by examiner

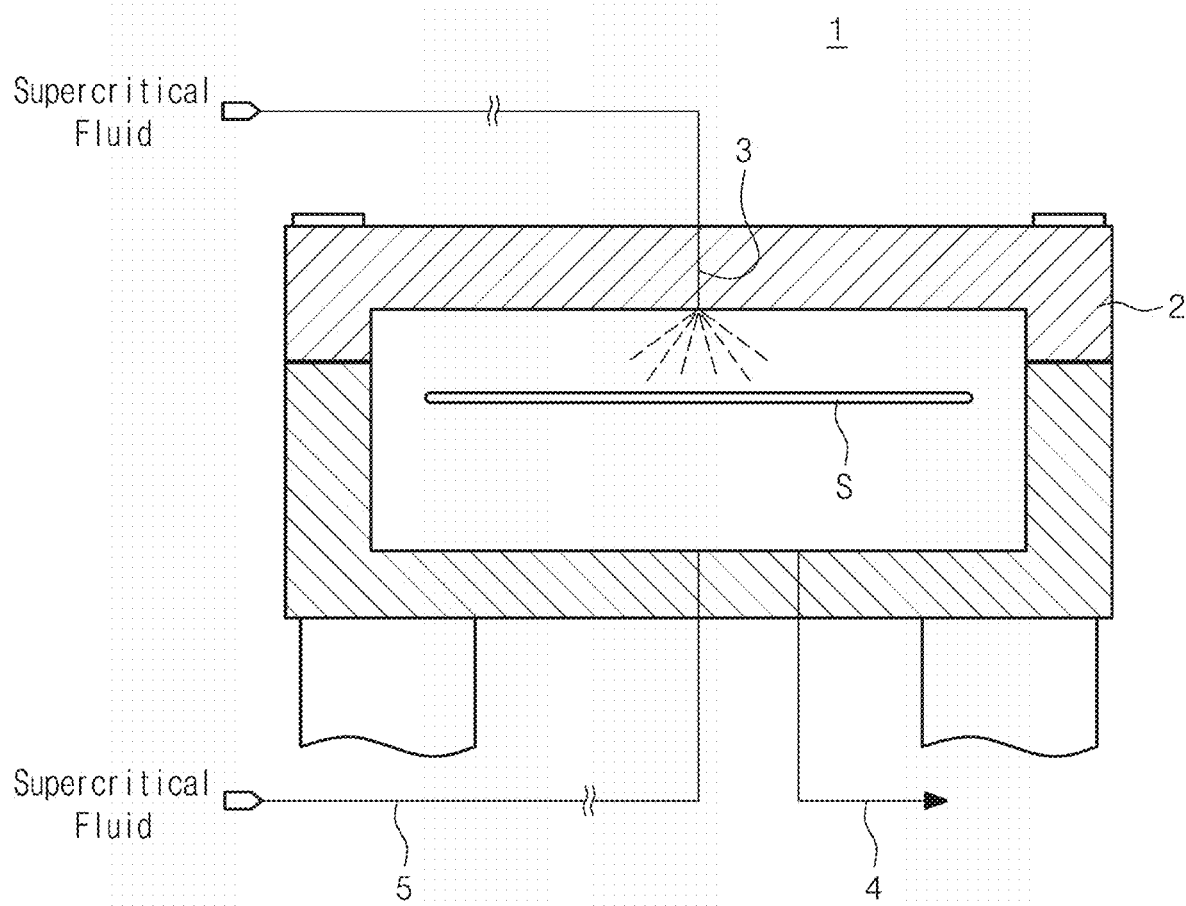

METHOD AND APPARATUS FOR TREATING SUBSTRATE

BACKGROUND

Embodiments of the inventive concept described herein relate to a substrate treating apparatus, and more specifically, to a substrate treating apparatus and a substrate treating method performing a supercritical process.

In general, semiconductor devices are manufactured from substrates such as wafers. Specifically, the semiconductor device is manufactured by performing a deposition process, a photolithography process, an etching process, and the like to form a fine circuit pattern on a top surface of a substrate.

During the processes, various foreign materials are attached to the top surface of the substrate on which the circuit pattern is formed, and thus a cleaning process of removing the foreign materials on the substrate is performed between the processes.

In general, the cleaning process includes a chemical treatment for removing foreign materials on the substrate by supplying a chemical to the substrate, a rinsing treatment for removing a chemical remaining on the substrate by supplying a deionized water, and a drying treatment for removing the deionized water remaining on the substrate.

A supercritical fluid is used for drying the substrate. According to an embodiment, the deionized water on the substrate is replaced with an organic solvent, and then the supercritical fluid is supplied to the top surface of the substrate in a high pressure chamber to dissolve an organic solvent remaining on the substrate in the supercritical fluid to remove it. When an isopropyl alcohol (hereinafter, IPA) is used as the organic solvent, a carbon dioxide ($CO_2$) having a relatively low critical temperature and critical pressure, and which dissolves well in the IPA is used as the supercritical fluid.

FIG. 15 illustrates a conventional substrate treating apparatus using a supercritical fluid.

As shown in FIG. 15, in the conventional substrate treating apparatus 1 using the supercritical fluid, the supercritical fluid supplied through a top injection line 3 may be liquefied in a state in which an inner pressure of the chamber 2 is low at a beginning of a process. Therefore, at the beginning of a supercritical drying process, the supercritical fluid supplied to a top part of the substrate S may be liquefied and may drop onto the substrate S by gravity, thereby damaging the substrate. In addition, it is exhausted through an exhaust port 4 under the substrate, and there is a problem that impurities including an IPA residue and particles may contaminate a bottom injection line 5 in the process.

SUMMARY

Embodiments of the inventive concept provide a substrate treating apparatus and a substrate treating method capable of preventing a supercritical fluid from directly contacting a substrate in an initial injection section.

Embodiments of the inventive concept provide a substrate treating apparatus and a substrate treating method capable of separating and supplying a gas according to a pressure of a chamber.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a high pressure chamber configured to form a treating space for performing a supercritical treating process therein; a substrate support unit configured to support a substrate at the treating space; a fluid supply unit configured to supply a treating fluid to the treating space; and an exhaust unit configured to exhaust an atmosphere of the treating space, and wherein the fluid supply unit includes a cover plate opposite to a treating surface of a substrate supported by the substrate support unit, and having a supply hole for supplying the treating fluid to the treating surface.

In an embodiment, the cover plate has a radius similar to or larger than a radius of the substrate.

In an embodiment, the supply hole is opposite to a center of the treating surface.

In an embodiment, the fluid supply unit includes: a first injection line at a top surface of the high pressure chamber opposite to a top surface of the cover plate and configured to supply the treating fluid to the top surface of the cover plate; and a second injection line configured to supply the treating fluid to the supply hole.

In an embodiment, the substrate treating apparatus further includes a control unit for controlling the fluid supply unit, and wherein the control unit controls the fluid supply unit to supply the treating fluid through the first injection line until a pressure of the treating space reaches a target pressure, and to supply the treating fluid through the second injection line after the pressure of the treating space reaches the target pressure.

In an embodiment, the first injection line in a plurality is positioned in a radial shape based on the first injection line.

The inventive concept provides a substrate treating apparatus. The substrate treating apparatus includes a high pressure chamber configured to form a treating space for performing a supercritical treating process therein; a substrate support unit configured to support a substrate at the treating space; a fluid supply unit configured to supply a treating fluid to the treating space; and an exhaust unit configured to exhaust an atmosphere of the treating space, and wherein the fluid supply unit includes: a first and second injection line provided at a top surface of the high pressure chamber; and a cover plate positioned between the top surface of the high pressure chamber and the substrate support unit, blocking the treating fluid supplied from the first injection line from being directly sprayed in a direction to a treating surface of the substrate, and having a supply hole connected to the second injection line and configured to directly supply the treating fluid to the treating surface of the substrate.

In an embodiment, the substrate treating apparatus further includes a control unit for controlling the fluid supply unit, and wherein the control unit controls the fluid supply unit to supply the treating fluid through the first injection line until a pressure of the treating space reaches a target pressure, and to supply the treating fluid through the second injection line after the pressure of the treating space reaches the target pressure.

In an embodiment, the target pressure is a critical pressure of the treating fluid. In an embodiment, In an embodiment, a radius of the cover plate is similar to a larger than a radius of the substrate.

In an embodiment, the supply hole is opposite to a center of the treating surface.

The inventive concept provides a substrate treating apparatus. The substrate treating apparatus includes a substrate support unit configured to support a substrate at a treating space of a chamber; a plate having a through hole formed therein and positioned opposite to a treating surface of the substrate; and a fluid supply unit for supplying a treating fluid to the treating space, and wherein the fluid supply unit includes a first injection line for supplying the treating fluid to a top surface of the plate; and a second injection line for supplying the treating fluid to the through hole of the plate.

In an embodiment, the substrate treating apparatus further includes a control unit for controlling the fluid supply unit, and wherein the control unit controls the fluid supply unit to firstly supply the treating fluid through the first injection line to prevent the treating fluid from directly contacting the substrate at an initial injection section of the treating fluid.

In an embodiment, the fluid supply unit firstly supplies the treating fluid to an edge direction of the substrate through the first injection line, and directly supplies the treating fluid through the second injection line to a top surface of the substrate when a pressure of the treating space reaches a target pressure.

In an embodiment, the substrate treating apparatus further includes a detector for detecting a pressure of the treating space, and the control unit controls a supplying of the treating fluid from the first injection line and the second injection line according to a pressure value of the treating space received from the detector.

In an embodiment, the control unit supplies the treating fluid through the second injection line when an inner pressure of the treating space reaches a critical pressure.

The inventive concept provides a substrate treating method. The substrate treating method includes a step for taking in a substrate to a treating space of a chamber to seat on a substrate support unit; a step for supplying a treating fluid to the treating space; a step for exhausting the treating fluid from the treating space; and a step for taking out the substrate from the chamber, and wherein the step for supplying the treating fluid includes: a first injection step for supplying the treating fluid through the first injection line formed at a top surface of the chamber so the treating fluid is provided from an edge region of the substrate; and a second injection step for supplying the treating fluid from the second injection line so the treating fluid is provided to a central region of the substrate.

In an embodiment, wherein at the first injection step, the first injection line supplies the treating fluid to a top surface of a cover plate positioned opposite from a treating surface of the substrate, and at the second injection step, the second injection line supplies the treating fluid to the central region of the substrate through a through hole formed at the cover plate.

In an embodiment, the first injection step is performed before a pressure of the treating space reaches a target pressure, and the second injection step is performed after the pressure of the treating space reaches the target pressure.

In an embodiment, the target pressure is a critical pressure of the treating fluid.

According to an embodiment of the inventive concept, a damage of a substrate may be prevented by blocking a supercritical fluid from directly contacting the substrate in an initial injection section.

According to an embodiment of the inventive concept, a supercritical fluid may be separately supplied according to a pressure of a housing.

The effects of the inventive concept are not limited to the above-described effects, and the effects not mentioned may be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 15 illustrates a conventional substrate treating apparatus using a supercritical fluid.

DETAILED DESCRIPTION

Figure 1:
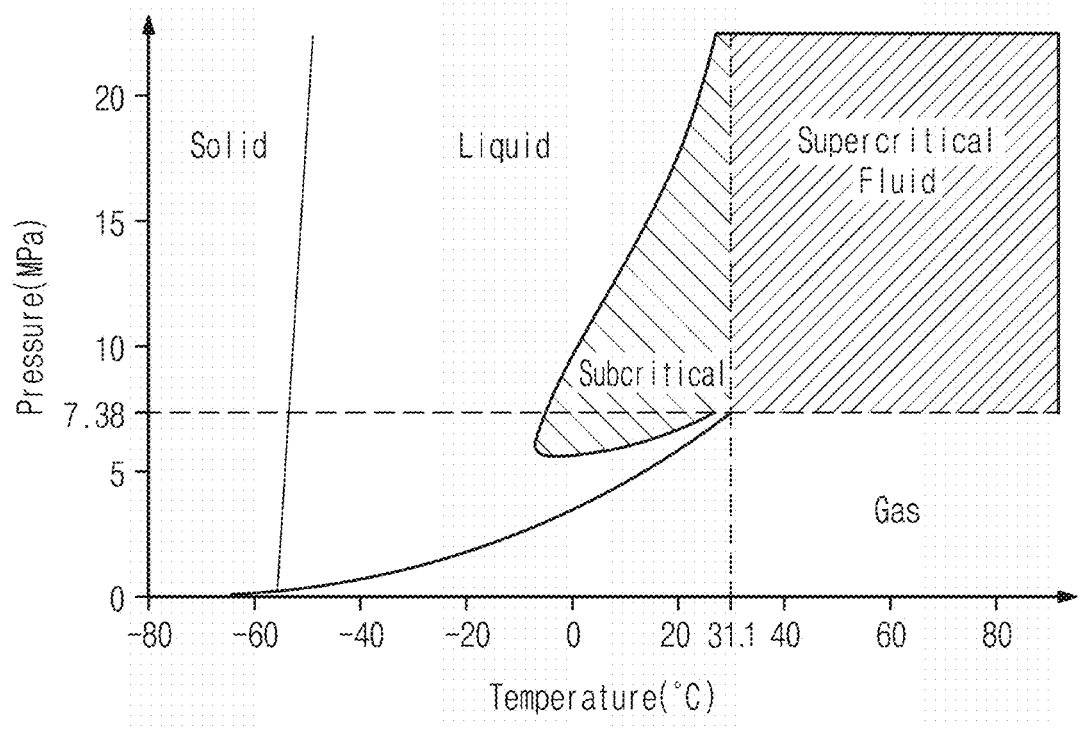
FIG. 1 is a graph illustrating a phase change of a carbon dioxide.

The inventive concept may be variously modified and may have various forms, and specific embodiments thereof will be illustrated in the drawings and described in detail. However, the embodiments according to the concept of the inventive concept are not intended to limit the specific disclosed forms. The embodiment is provided to more fully explain the inventive concept to those with average knowledge in the art. Therefore, a form of the element in the drawing may be exaggerated to emphasize a clearer description.

The substrate treating apparatus 100 may perform a supercritical process of treating a substrate S using a supercritical fluid as a process fluid.

Here, the substrate S is a comprehensive concept including a semiconductor device, a flat panel display (FPD), and other substrates used in manufacturing an object having a circuit pattern formed on a thin film. Examples of such a substrate S include various wafers including a silicon wafer, a glass substrate, an organic substrate, and the like.

A supercritical fluid refers to a fluid having reached a supercritical state exceeding a critical temperature and a critical pressure and at a phase having simultaneous properties of a gas and a liquid. The supercritical fluid has a molecular density close to a liquid and a viscosity close to a gas, and thus is advantageous for chemical reactions due to an excellent diffusive power, penetrative power, and dissolving power. Also, the supercritical fluid does not apply an interfacial tension to microstructures because it has nearly no surface tension.

A supercritical process is performed using such characteristics of the supercritical fluid, and representative examples thereof include a supercritical drying process and a supercritical etching process. Hereinafter, the supercritical process will be described based on the supercritical drying process. However, since this is only for ease of description, the substrate treating apparatus 100 may perform a supercritical process other than the supercritical drying process.

The supercritical drying process may be performed by drying the substrate S by dissolving an organic solvent remaining on the circuit pattern of the substrate S with the supercritical fluid, and may have an excellent drying efficiency and may prevent a collapsing phenomenon. As the supercritical fluid used in the supercritical drying process, a material having a miscibility with the organic solvent may be used. For example, supercritical carbon dioxide ($scCO_2$) may be used as the supercritical fluid.

FIG. 1 is a graph of a phase change of a carbon dioxide.

The carbon dioxide has an advantage having of a relatively low critical temperature of 31. ° C. and a relatively low critical pressure of 7.38 Mpa, making it easy to make into a supercritical state, and easy to control a phase change by controlling a temperature and a pressure. Also, the carbon dioxide has a low price. In addition, the carbon dioxide is harmless to the human body because it is not toxic. Also, it has nonflammable and inert properties, and a supercritical carbon dioxide has a high diffusion coefficient of 10 to 100 times compared to water or other organic solvents, so it penetrates quickly and so a replacing of the organic solvent is quick, and it is advantageous for drying the substrate S having a fine circuit pattern because it has almost no surface tension. In addition, the carbon dioxide can be recycled from what is produced as a by-product of various chemical reactions, and simultaneously used in the supercritical drying process, then converted into a gas, and separated from the organic solvent to be reused. Therefore it is less burdensome in terms of environmental pollution.

Hereinafter, an embodiment of the substrate treating apparatus 100 according to the inventive concept will be described. The substrate treating apparatus 100 according to an embodiment of the inventive concept may include the supercritical drying process to perform a cleaning process.

Figure 2:
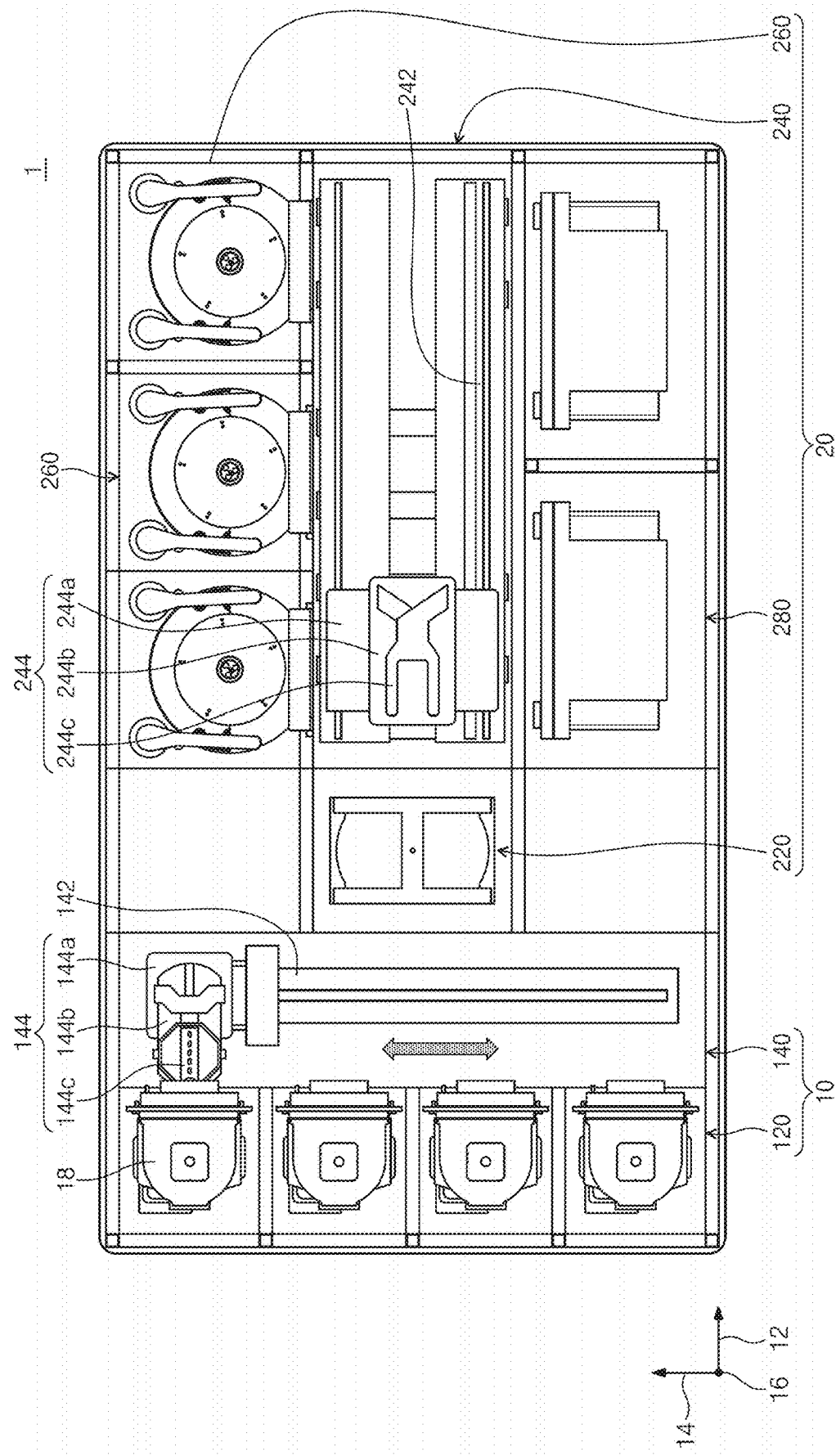
FIG. 2 is a plan view illustrating an embodiment of a substrate treating apparatus.
Figure 3:
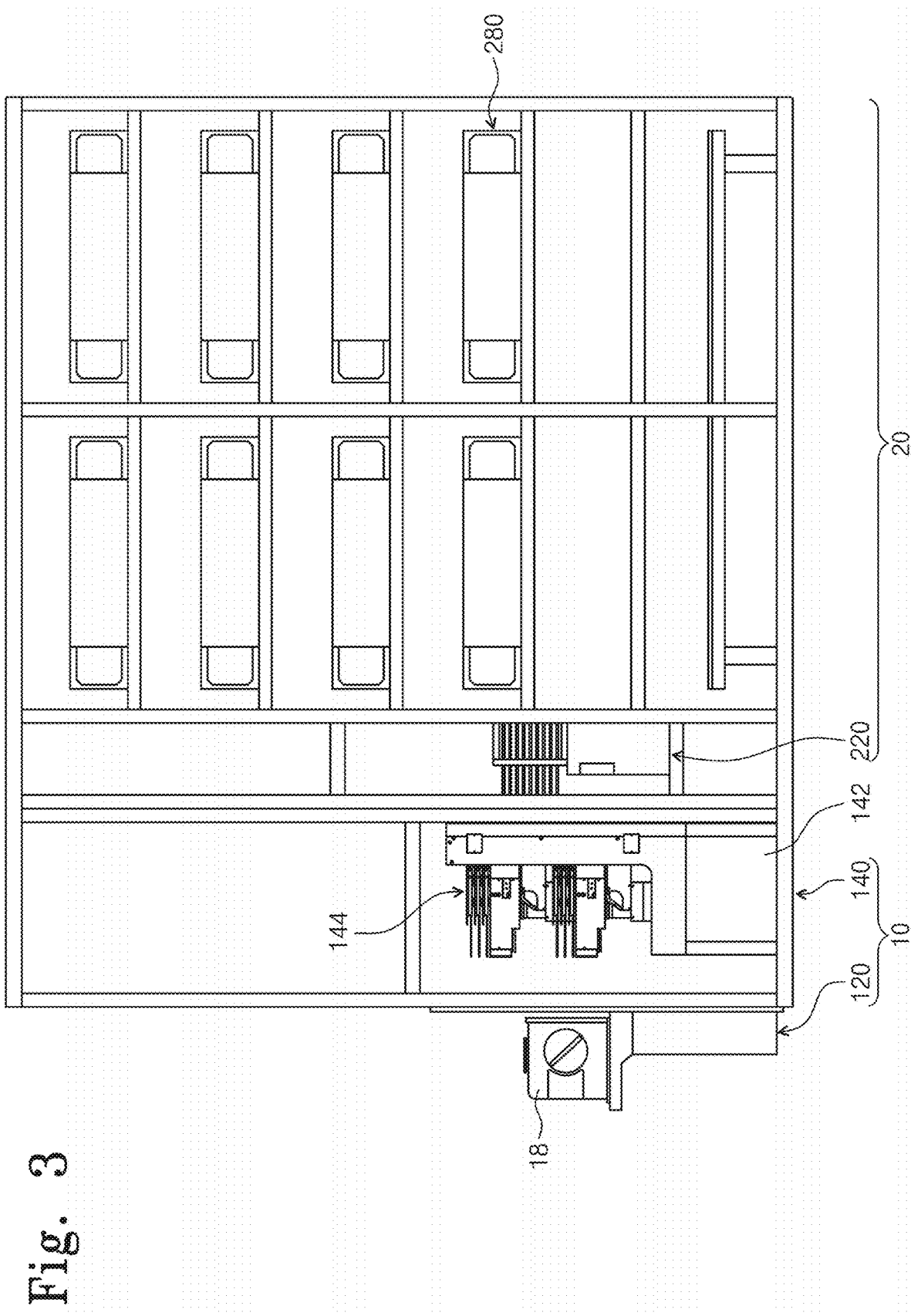
FIG. 3 is a cross-sectional view illustrating an embodiment of the substrate treating apparatus.

FIG. 2 is a plan view of an embodiment of the substrate treating apparatus 100, and FIG. 3 is a cross-sectional view of the substrate treating apparatus 100.

Referring to FIG. 2 and FIG. 3, the substrate treating apparatus 100 includes an index module 1000 and a process module 2000.

The index module 1000 may receive the substrate S from an outside and transfer the substrate S to the process module 2000, and the process module 2000 may perform the supercritical drying process.

The index module 1000 is an equipment front end module (EFEM) and includes a load port 1100 and a transfer frame 1200.

A container C in which the substrate S is stored is placed on the load port 1100. As the container C, a front opening unified pod (FOUP) may be used. The container C may be taken into the load port 1100 from the outside by an overhead transfer (OHT) or may be taken out from the load port 1100 to the outside.

The transfer frame 1200 transfers the substrate S between the container C placed on the load port 1100 and the process module 2000. The transfer frame 1200 includes an index robot 1210 and an index rail 1220. The index robot 1210 may move along the index rail 1220 and may transfer the substrate S.

The process module 2000 is a module that actually performs a process, and includes a buffer chamber 2100, a transfer chamber 2200, a first process chamber 3000, and a second process chamber 4000.

The buffer chamber 2100 provides a space in which the substrate S transferred between the index module 1000 and the process module 2000 temporarily remains. A buffer slot on which the substrate S is placed may be provided at the buffer chamber 2100. For example, the index robot 1210 may withdraw the substrate S from the container C and place it in the buffer slot, and the transfer robot 2210 of the transfer chamber 2200 may withdraw the substrate S placed on the buffer slot and transfer it to the first process chamber 3000 or the second process chamber 4000. The buffer slot provided in a plurality may be disposed at the buffer chamber 2100 to place a plurality of substrates S thereon.

The transfer chamber 2200 transfers the substrate S between the buffer chamber 2100, the first process chamber 3000, and the second process chamber 4000 disposed around the transfer chamber 2200. The transfer chamber 2200 may include a transfer robot 2210 and a transfer rail 2220. The transfer robot 2210 may move along the transfer rail 2220 and may transfer the substrate S.

The first process chamber 3000 and the second process chamber 4000 may perform a cleaning process. In this case, the cleaning process may be sequentially performed in the first process chamber 3000 and the second process chamber 4000. For example, in the first process chamber 3000, a chemical process, a rinsing process, and an organic solvent process may be performed during the cleaning process, and then the supercritical drying process may be performed in the second process chamber 4000.

The first process chamber 3000 and the second process chamber 4000 are disposed on a side of the transfer chamber 2200. For example, the first process chamber 3000 and the second process chamber 4000 may be disposed to face each other at other sides of the transfer chamber 2200.

In addition, the first process chamber 3000 and the second process chamber 4000 may be provided in a plurality at the process module 2000. A plurality of process chambers 3000 and 4000 may be disposed in a direction at a side of the transfer chamber 2200, may be stacked in a vertical direction, or may be disposed in a combination.

Of course, an arrangement of the first process chamber 3000 and the second process chamber 4000 are not limited to the above-described examples, and may be appropriately changed in consideration of various factors such as a footprint or a process efficiency of the substrate treating apparatus 100.

Hereinafter, the first process chamber 3000 will be described.

Figure 4:
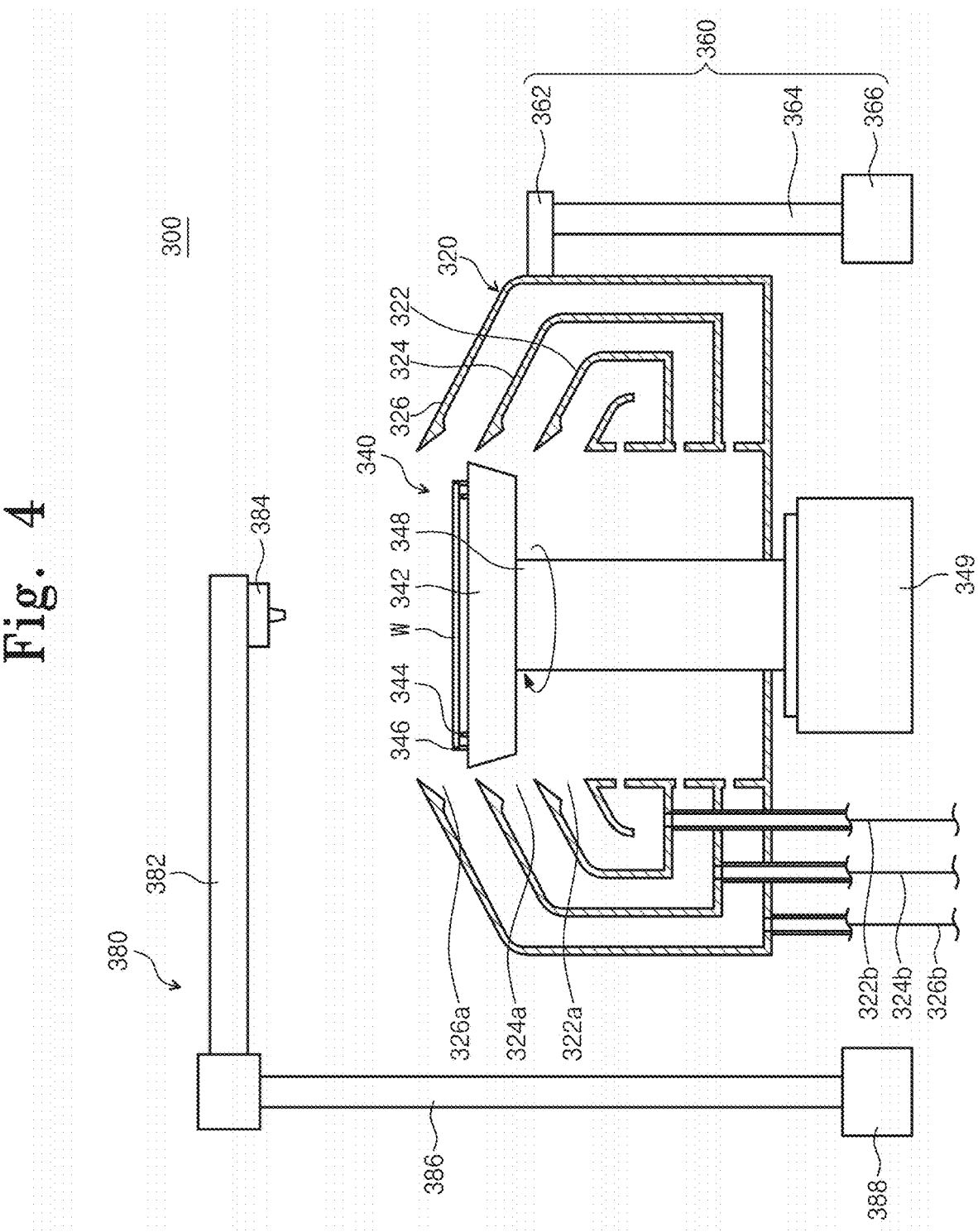
FIG. 4 is a cross-sectional view of a first process chamber of FIG. 2.

FIG. 4 is a cross-sectional view of the first process chamber 3000 of FIG. 2.

The first process chamber 3000 may perform a chemical process, a rinsing process, and an organic solvent process. Of course, the first process chamber 3000 may selectively perform only some of these processes. Here, the chemical process is a process of removing foreign materials on the substrate S by providing a cleaner onto the substrate S, the rinsing process is a process of providing a rinsing agent to the substrate S to remove the cleaner remaining on the substrate, and the organic solvent process is a process of replacing the rinsing agent remaining between the a circuit pattern of the substrate S with an organic solvent with a low surface tension.

Referring to FIG. 4, the first process chamber 3000 includes a support member 3100, a nozzle member 3200, and a recollecting member 3300.

The support member 3100 may support the substrate S and rotate a supported substrate S. The support member 3100 may include a support plate 3110, a support pin 3111, a chucking pin 3112, a rotation shaft 3120, and a rotation driver 3130.

The support plate 3110 has a top surface having a same or a similar shape to the substrate S, and a support pin 3111 and a chucking pin 3112 are formed on the top surface of the support plate 3110. The support pin 3111 may support the substrate S, and the chucking pin 3112 may fix the supported substrate S.

A rotation shaft 3120 is connected to a bottom portion of the support plate 3110. The rotation shaft 3120 receives a rotation force from the rotation driver 3130 to rotate the support plate 3110. Accordingly, the substrate S seated on the support plate 3110 may rotate. In this case, the chucking pin 3112 may prevent the substrate S from deviating from a normal position.

The nozzle member 3200 sprays a chemical onto the substrate S. The nozzle member 3200 includes a nozzle 3210, a nozzle bar 3220, a nozzle shaft 3230, and a nozzle shaft driver 3240.

The nozzle 3210 sprays the chemical onto the substrate S seated on the support plate 3110. The chemical may be a cleaning agent, a rinsing agent, or an organic solvent. Here, as the cleaning agent, a hydrogen peroxide ($H_2O_2$) solution or a solution obtained by mixing an ammonia ($NH_4OH$), a hydrochloric acid (HCl), or a sulfuric acid ($H_2SO_4$) to a hydrogen peroxide, or a hydrofluoric acid (HF) solution, etc may be used. Also, a deionized water can be used as the rinsing agent. In addition, for the organic solvent a solution or a gas including an isopropyl alcohol, an ethyl glycol, a 1-propanol, a tetra hydraulic franc, a 4-hydroxyl, a 4-methyl, a 2-pentanone, a 1-butanol, a 2-butanol a methanol, an ethanol, an n-propyl alcohol, and a dimethylether may be used.

The nozzle 3210 is formed on a bottom surface of an end of the nozzle bar 3220. The nozzle bar 3220 is coupled to the nozzle shaft 3230, and the nozzle shaft 3230 is provided to be lifted or rotated. The nozzle shaft driver 3240 may adjust the position of the nozzle 3210 by lifting or rotating the nozzle shaft 3230.

The recollecting member 3300 recovers the solution supplied to the substrate S. When the solution is supplied to the substrate S by the nozzle member 3200, the support member 3100 may rotate the substrate S to uniformly supply the chemical to an entire region of the substrate S. When the substrate S is rotated, the chemical is scattered from the substrate S, and the scattered chemical may be recollected by the recollecting member 3300.

The recollecting member 3300 may include a recollecting container 3310, a recollecting line 3320, a lifting/lowering bar 3330, and a lifting/lowering driver 3340.

The recollecting container 3310 is provided in an annular ring shape surrounding the support plate 3110. The recollecting container 3310 may be provided in a plurality, and the plurality of recollecting containers 3310 are provided in a ring shape formed sequentially away from the support plate 3110 when viewed from above, and the further a recollecting container 3310 is from the support plate 3110, the higher a height of the recollecting container 3310 is. Accordingly, a recollecting port 3311 into which the scattered chemical from the substrate S is introduced is formed in a space between the recollecting containers 3310.

A recollecting line 3320 is formed on a bottom surface of the recollecting container 3310. The recollecting line 3320 supplies a chemical recollected to the recollecting container 3310 to a chemical regeneration system (not shown).

The lifting/lowering bar 3330 is connected to the recollecting container 3310 to receive a power from the lifting/lowering driver 3340 to move the recollecting container 3310 upwardly and downwardly. When there are a plurality of recollecting containers 3310, the lifting/lowering bar 3330 may be connected to a recollecting container 3310 disposed at an outermost side. The lifting/lowering driver 3340 may lift/lower the recollecting container 3310 through the lifting/lowering bar 3330 to adjust the recollecting port 3311 into which the scattered chemical is introduced into among a plurality of recollecting ports 3311.

Hereinafter, the second process chamber 4000 will be described.

The second process chamber 4000 may perform the supercritical drying process using a supercritical fluid. Of course, as described above, the process performed in the second process chamber 4000 may be another supercritical process in addition to the supercritical drying process, and further, the second process chamber 4000 may perform a process using another process fluid instead of the supercritical fluid.

As described above, the second process chamber 4000 may be disposed on a side of the transfer chamber 2200. When the second process chamber 4000 is provided in a plurality they may be disposed in a direction, stacked up and down, or may be disposed by a combination thereof on a side surface of the transfer chamber 2200. In the substrate treating apparatus 100, the load port 1100, the transfer frame 1200, the buffer chamber 2100, and the transfer module 2200 may be sequentially disposed, and the second process chamber 4000 may be arranged in a direction on a side surface of the transfer chamber 2200 in a same direction.

Hereinafter, an embodiment of the second process chamber 4000 will be described.

Figure 5:
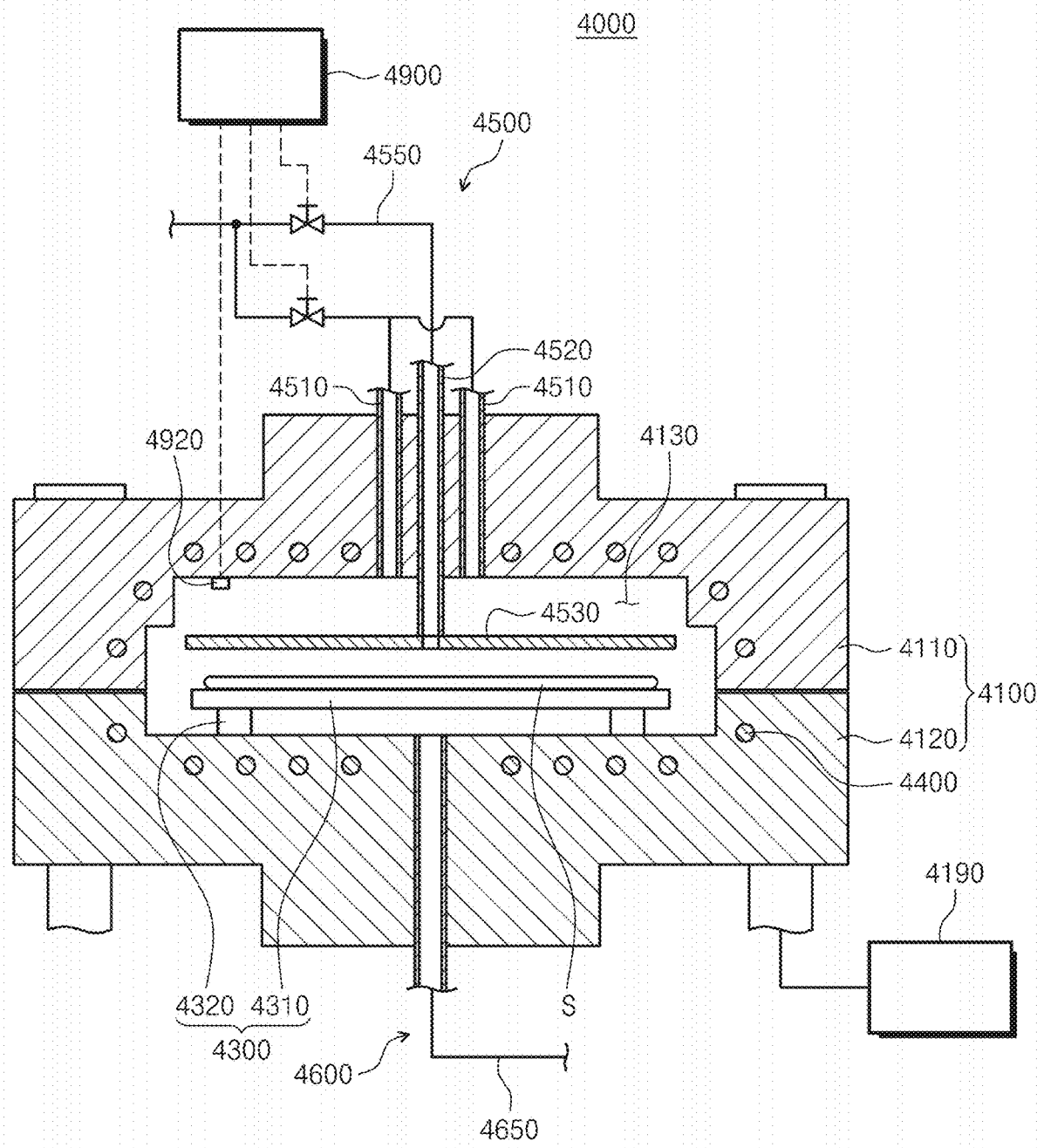
FIG. 5 is a cross-sectional view of an embodiment of a second process chamber of FIG. 2.
Figure 6:
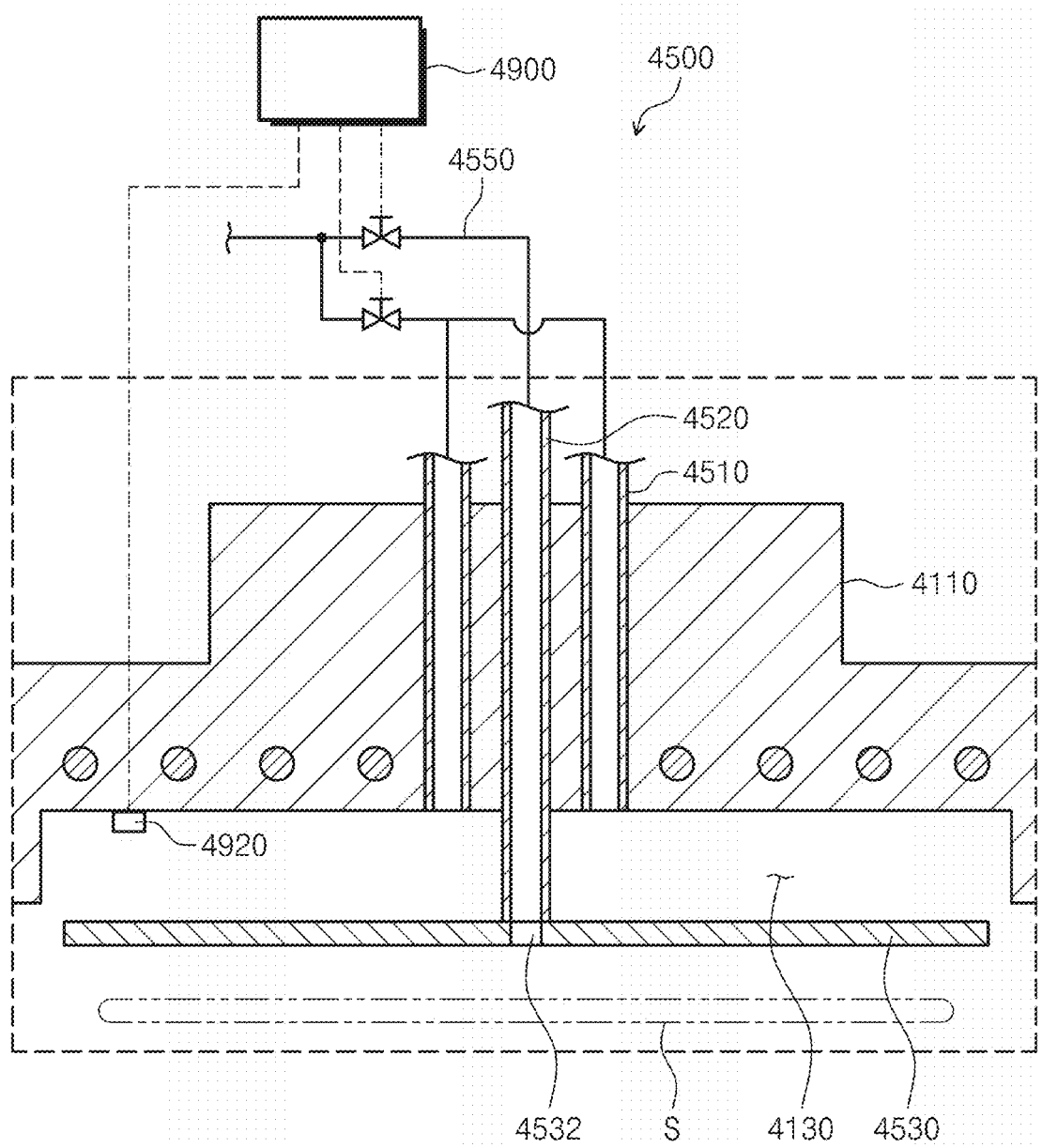
FIG. 6 is an enlarged view of a main part for describing a fluid supply unit illustrated in FIG. 5.
Figure 7:
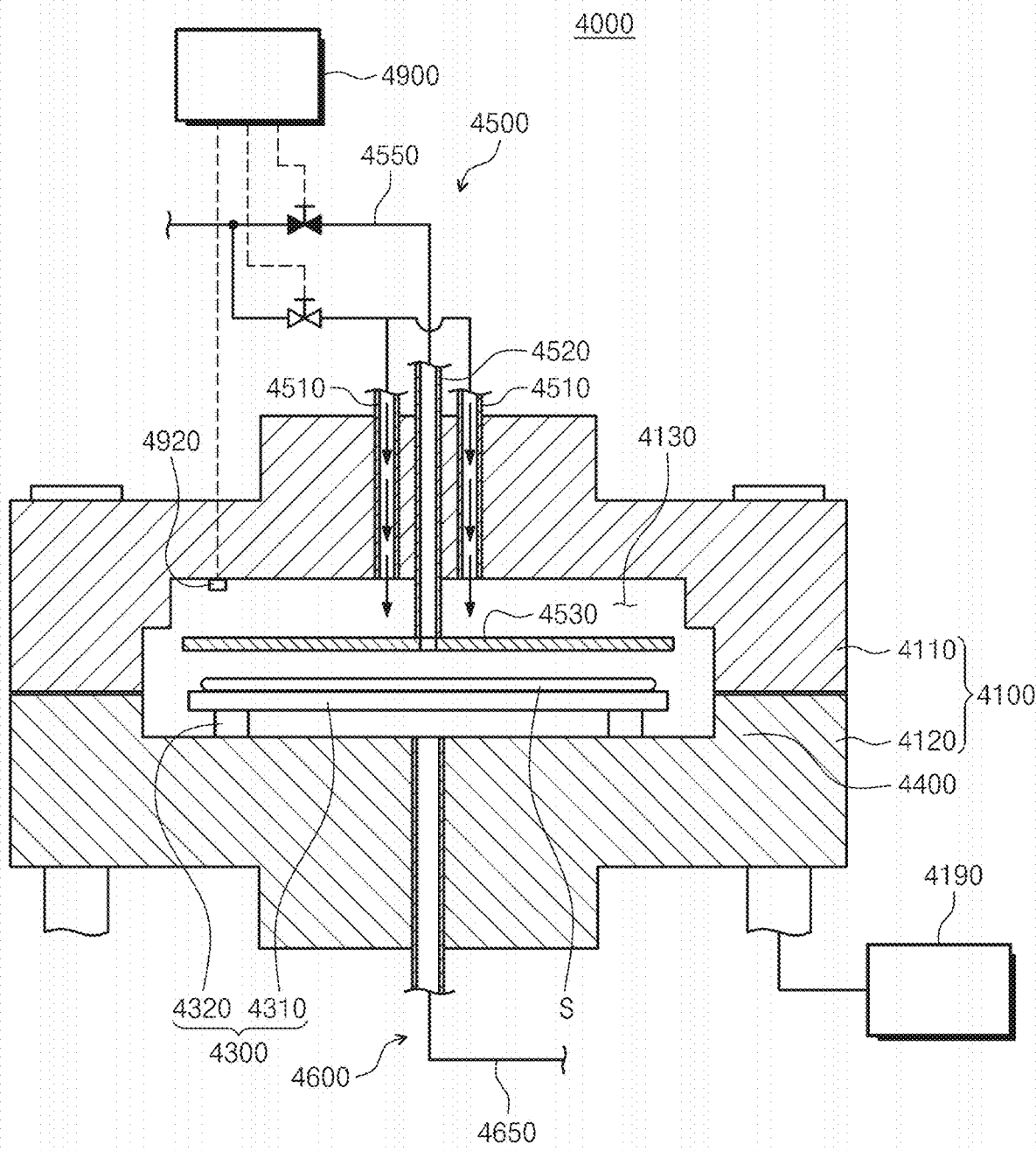
FIG. 7 to FIG. 10 illustrate a supercritical fluid supply process in the second process chamber.
Figure 8:
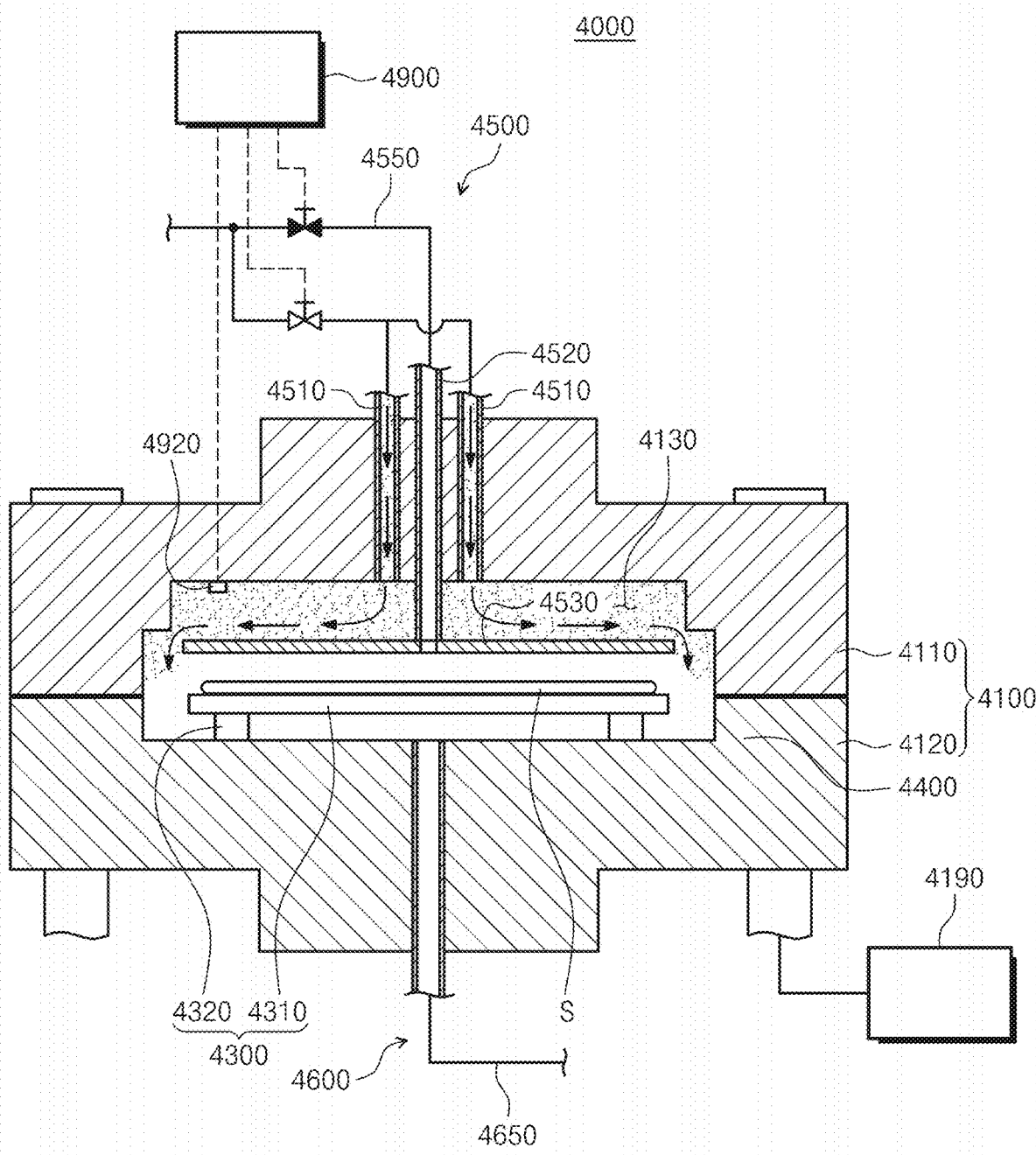
Figure 9:
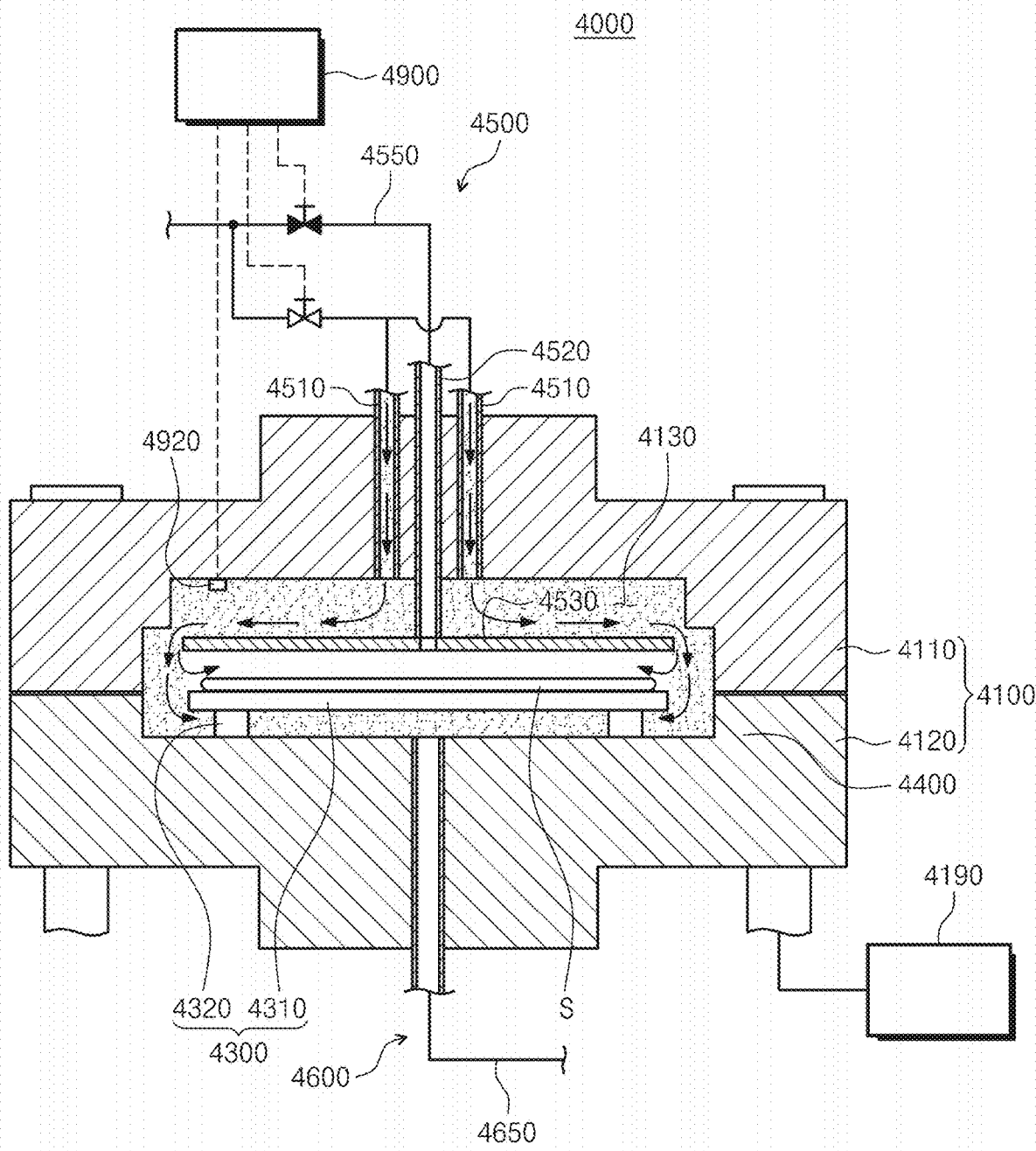
Figure 10:
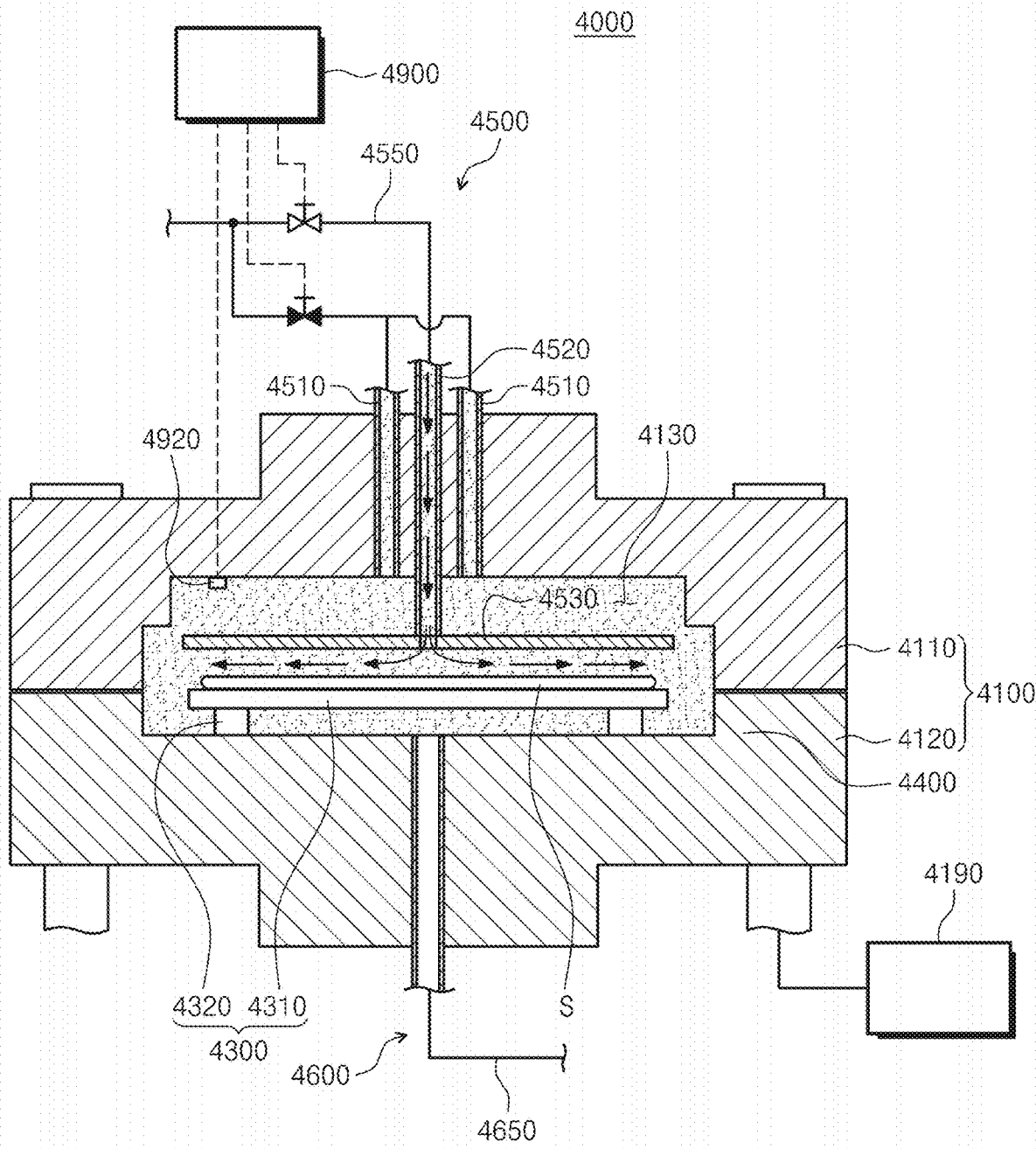

FIG. 5 is a cross-sectional view of an embodiment of the second process chamber 4000 of FIG. 2, and FIG. 6 is an enlarged view of a main part for describing a fluid supply unit.

Referring to FIG. 5 and FIG. 6, the second process chamber 4000 may include a housing 4100, a support member 4300, a heating member 4400, a fluid supply unit 4500, and a fluid exhaust unit 4600.

The housing 4100 is a high-pressure chamber providing a space in which the supercritical drying process is performed. The housing 4100 provides a space in which the supercritical drying process is performed. The housing 4100 is made of a material capable of enduring a high pressure greater than or equal to a critical pressure. The housing 4100 has a top body 4110, a bottom body 4120, and a bottom body, and the top body 4110 and the bottom body 4120 are combined with each other to provide the above-described treating space 4130. The top body 4110 is provided above the bottom body 4120. The top body 4110 has a fixed position, and the bottom body 4120 may be lifted and lowered by a driving member 4190 such as a cylinder. Of course, unlike the above-described example, a position of the bottom body 4120 in the housing 4100 may be fixed, and the top body 4110 may be provided in a structure to be lifted and lowered by a driving member 4190 such as a cylinder.

When the bottom body 4120 is spaced apart from the top body 4110, the treating space 4130 is opened, and at this time, the substrate S is taken in or taken out. During the process, the bottom body 4120 is in close contact with the top body 4110 so that the treating space 4130 is sealed from the outside. Here, the substrate S may be introduced into the second process chamber 400 in a state in which an organic solvent remains thereon having gone through an organic solvent process in the first process chamber 3000.

Although not shown, according to another embodiment, an opening is provided on a surface of the housing, and the substrate may be taken into the housing or taken out from the housing through the opening.

The support member 4300 supports the substrate S within the treating space 4130 of the housing 4100. The support member 4300 may be installed at the bottom body 4120 to support the substrate S. The support member 4300 may have a form to lift and support the substrate S. The support member 4300 may include a holder 4310 on which the substrate is placed and lugs 4320 supporting the holder 4310 to be spaced apart from a bottom surface of the bottom body 4120. In another way, the support member may be installed at the top body 4110 to support the substrate S. In this case, the support member (not shown) may have a form of hanging and supporting the substrate S.

Here, a top surface of the substrate S is a pattern surface that is a treating surface, and may be seated on the support member 4300 such that a bottom surface becomes a non-pattern surface.

The heating member 4400 heats an inside of the housing 4100. The heating member 4400 may heat the supercritical fluid supplied into the second process chamber 4000 at a critical temperature or higher to maintain the supercritical fluid in a supercritical state or to become the supercritical fluid again if liquefied. The heating member 4400 may be buried and installed in a wall of the housing 4100. The heating member 4400 may be provided as, for example, a heater that generates a heat by receiving a power from the outside.

The fluid supply unit 4500 supplies a treating fluid to the treating space 4130 of the housing 4100. According to an embodiment, the treating fluid may be supplied to the treating space 4130 in a supercritical state. Unlike this, the treating fluid may be supplied to the treating space 4130 in a gas state, and may be phase-changed to a supercritical state in the treating space 4130. Hereinafter, for convenience, the treating fluid is defined as a supercritical fluid.

According to an embodiment, the fluid supply unit 4500 may include a first injection line 4510, a second injection line 4520, and a cover plate 4530.

Figure 13:
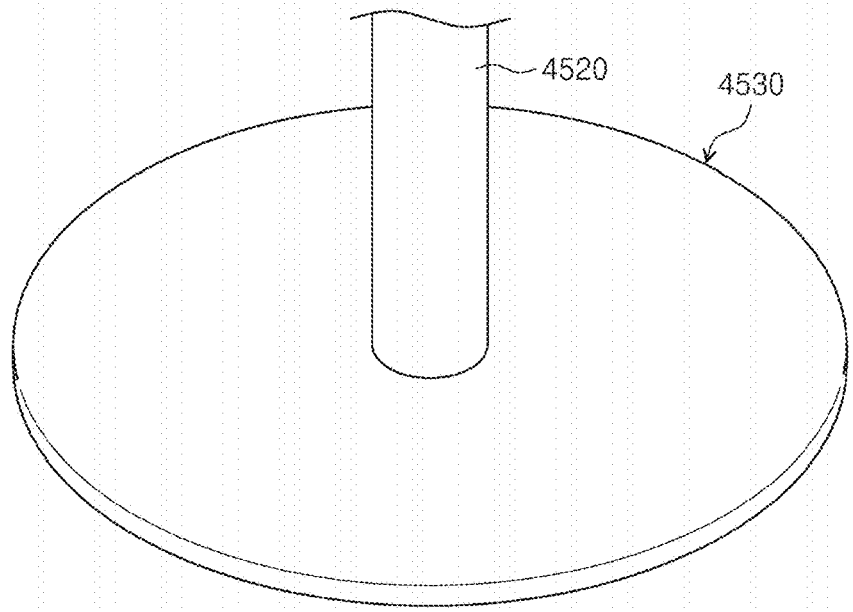
FIG. 13 and FIG. 14 are perspective views illustrating a cover plate illustrated in FIG. 5.
Figure 14:
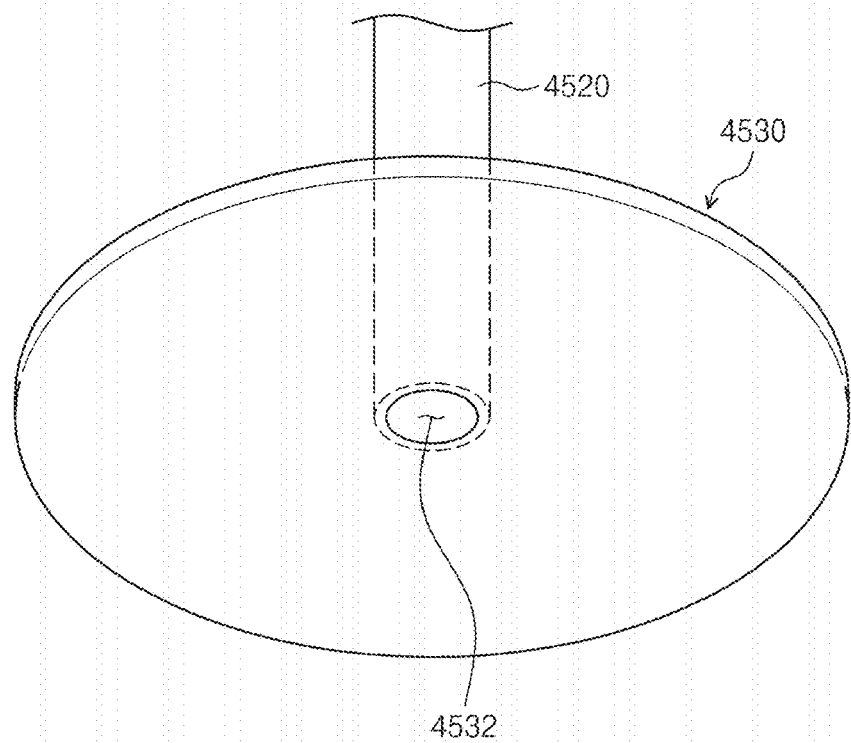

FIG. 13 and FIG. 14 are perspective views showing a cover plate.

Referring to FIG. 5, FIG. 13 and FIG. 14, the cover plate 4530 may be provided to face the treating surface of the substrate supported by the support member 4300. The cover plate 4530 may be provided in a circular plate shape. A radius of the cover plate may be similar to or larger than a radius of the substrate S. The cover plate 4530 has a supply hole 4532 for supplying the supercritical fluid to the treating surface of the substrate. The cover plate 4530 may have a radius similar to or larger than the radius of the substrate. The supply hole 4532 may be formed at a position facing a center of the treating surface. The cover plate 4530 may prevent the supercritical fluid supplied through the first injection line 4510 from being directly sprayed onto the treating surface of the substrate S.

Referring back to FIG. 5 and FIG. 6, the first injection line 4510 and the second injection line 4520 supply the supercritical fluid to the treating space 4130 of the second process chamber 4000. Each of the first injection line 4510 and the second injection line 4520 may be connected to a supply line 4550 for supplying the supercritical fluid. In this case, a valve for adjusting a flow rate of the supercritical fluid may be installed at the supply line 4550.

The first injection line 4510 supplies the supercritical fluid toward a top surface of the cover plate 4530. The first injection line 4510 supplies the supercritical fluid from a top surface of the top body 4100 facing the top surface of the cover plate toward the top surface of the cover plate 4530. The first injection line 4510 may be radially disposed around the second injection line 4520. The second injection line 4520 supplies the supercritical fluid to the supply hole 4532.

According to an embodiment, the first injection line 4510 is coupled to the top body 4110. The second injection line 4520 may pass through the top body 4110 and may be connected to the supply hole 4532 of the cover plate 4530.

The second injection line 4520 may inject the supercritical fluid into a central region of the substrate S. The supply hole 4532 to which the second injection line 4520 is connected may be positioned vertically above a center of the substrate S supported by the support member 4300. Accordingly, the supercritical fluid injected from the second injection line 4520 may reach the central region of the substrate S and spread to an edge region, thereby being uniformly provided to the entire region of the substrate S.

A control unit 4900 controls the fluid supply unit 4500. The control unit 4900 may control the fluid supply unit 4500 to supply the supercritical fluid through the first injection line 4510 until a pressure of the treating space 4130 reaches a target pressure, and then supply the supercritical fluid through the second injection line 4520 after the pressure of the treating space 4130 reaches the target pressure. The pressure sensor 4920 is installed within the housing 4100. A data measured by the pressure sensor 4920 may be provided to the control unit 4900.

The control unit 4900 first supplies the supercritical fluid through the first injection line 4510, and later controls the fluid supply unit 4500 to supply the supercritical fluid to the second injection line 4520. Since the supercritical drying process may be initially performed in a state in which an inside of the second process chamber 4000 is less than a critical pressure, the supercritical fluid supplied into the second process chamber 4000 may be liquefied. Accordingly, when the supercritical fluid is supplied to the second injection line 4520 at a beginning of the supercritical drying process, the supercritical fluid may be liquefied and drop to a treating surface of the substrate S by gravity, thereby damaging the substrate S. Therefore, the supercritical fluid may be supplied to a space between the cover plate 4530 and the top body 4110 through the first injection line 4510, and when an inner pressure of the second process chamber 4000 reaches a critical pressure, the supercritical fluid may be directly supplied to the treating surface of the substrate 4520 to prevent the supplied supercritical fluid from liquifying and dropping to the substrate.

In addition, when the supercritical fluid is supplied through the first injection line 4510 at the beginning of the supercritical drying process, an inner pressure of the housing 4100 is low, and thus a supplied supercritical fluid may be sprayed at a high speed. When the supercritical fluid sprayed at such a high speed directly reaches the treating surface of the substrate, a part of the supercritical fluid directly sprayed on the substrate S may be bent due to a physical pressure of the supercritical fluid to cause a leaning phenomenon. In addition, the substrate S is shaken by a spraying force of the supercritical fluid, and thus an organic solvent remaining on the substrate S flows, causing a damage to the circuit pattern of the substrate S. Accordingly, the cover plate 4530 disposed between the first injection line 4510 and the substrate may prevent a damage to the substrate S by a physical force of the supercritical fluid by preventing the supercritical fluid from being directly sprayed onto the substrate S.

The exhaust port 4600 exhausts the supercritical fluid from the second process chamber 4000. The exhaust port 4600 may be connected to the exhaust line 4650 for exhausting the supercritical fluid. In this case, a valve for adjusting a flow rate of the supercritical fluid exhausted to the exhaust line 4650 may be installed at the exhaust port 4600. The supercritical fluid exhausted through the exhaust line 4650 may be discharged to an atmosphere or supplied to the supercritical fluid regeneration system (not shown) for regenerating the supercritical fluid.

The exhaust port 4600 may be formed at a bottom wall of the housing 4100. In the latter stage of the supercritical drying process, the supercritical fluid is exhausted from the second process chamber 4000, and an inner pressure thereof is lowered to a critical pressure or less, so that the supercritical fluid may be liquefied. The liquefied supercritical fluid may be discharged through the exhaust port 4600 formed at a bottom wall of the housing 4100 by gravity.

Although the substrate treating apparatus 100 according to the inventive concept supplies the supercritical fluid to the substrate S to treat the substrate, the substrate treating apparatus 100 according to the inventive concept is not limited to performing such a supercritical process. Accordingly, the second process chamber 4000 of the substrate treating apparatus 100 may process the substrate S by supplying another process fluid to the supply port 4500 instead of the supercritical fluid. In this case, instead of the supercritical fluid, an organic solvent or a gas of other various components, a plasma gas, an inert gas, and the like may be used as a process fluid.

Meanwhile, the controller 4900 may control components of the substrate treating apparatus 100. For example, the controller 4900 may control the heating member 4400 to adjust an inner temperature of the housing 4100. For another example, the control unit 4900 may control a valve installed at the nozzle member 2320, the supply line 4550, or the exhaust line 4650 to adjust a flow rate of a chemical or the supercritical fluid. The controller 4900 may be implemented as a computer or a similar device using a hardware, a software, or a combination thereof.

As for the hardware, the control unit 4900 may be implemented by application specific circuits (ASICs), digital signal processors (DSPs), digital signal processing devices (DSPDs), programmable log devices (PLDs), field programmable processors (FGAs), or processors, micro-controllers, microprocessors, or electric devices performing a similar controlling function to these.

In addition, as for the software, the control unit may be implemented by a software code or a software application written in one or more program languages. The software may be executed by a control unit implemented in hardware. In addition, the software may be installed by being transmitted from an outer device such as a server to the above-described hardware configuration.

Hereinafter, a substrate treating method according to the inventive concept will be described using the above-described substrate treating apparatus 100. However, since this is only for the purpose of explanation, the substrate treating method may be carried out using other devices identical or similar thereto in addition to the substrate treating apparatus 100 described above. In addition, the substrate treating method according to the inventive concept may be stored in a computer-readable recording medium in the form of a code or a program for performing the same.

Figure 11:
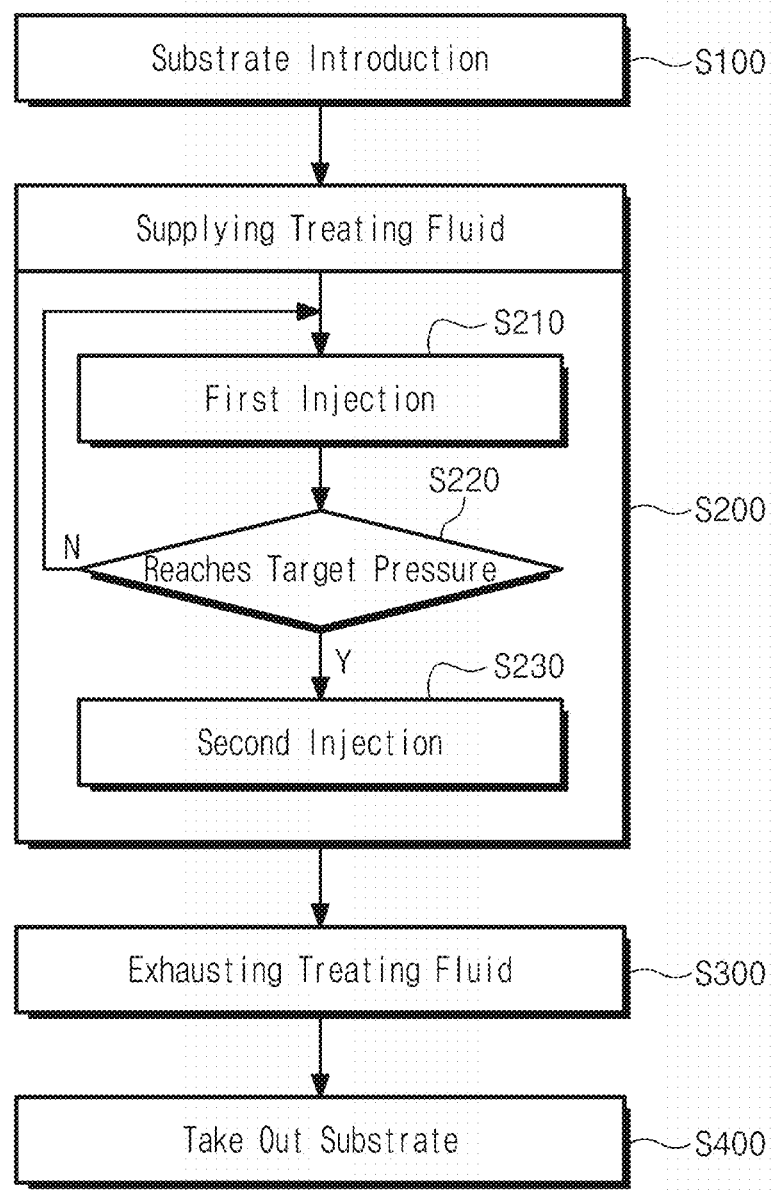
FIG. 11 is a flowchart for describing a substrate treating method in the second process chamber.

FIG. 11 is a flowchart for describing the substrate treating method in the second process chamber.

Referring to FIG. 7 to FIG. 11, the substrate treating method includes a step of taking the substrate into a treating space of the housing to place on the support member S100; a step of supplying the supercritical fluid to the treating space S200; a step of exhausting the supercritical fluid from the treating space S300; and a step of taking out the substrate from the housing S400. Here, the step of supplying the supercritical fluid S200 may include a first injection step of supplying the supercritical fluid through the first injection line S210, a step of comparing whether a pressure of the treating space 4130 has reached a target pressure S220, and a second injection step of supplying the treating fluid through the second injection line 4520 so the treating fluid is provided to a central region of the substrate S230.

In the supercritical fluid supply step S200, the fluid supply unit 4500 may first supply the supercritical fluid from the first injection line 4510. Thereafter, the second injection line 4520 may supply the supercritical fluid. The supercritical drying process may be initially performed in a state in which an inside of the second process chamber 4000 is less than a critical pressure. When the inside of the second process chamber 4000 has not reached the critical pressure, the supercritical fluid supplied to the inside may be liquefied. When the supercritical fluid is liquefied, it may fall onto the substrate S by gravity and damage the substrate S. Accordingly, the first injection line 4510 first supplies the supercritical fluid. The supercritical fluid supplied through the first injection line 4510 is blocked by the top surface of the cover plate 4530, thereby blocking direct contact with the treating surface of the substrate S. The supercritical fluid moves to the outside of the treating space (outer region of the substrate) in a space between the cover plate 4530 and a top surface of the top body 4110. That is, the cover plate 4530 prevents the supercritical fluid supplied from the first injection line 4510 from being directly sprayed onto the treating surface of the substrate S.

A supply of the supercritical fluid through the first injection line 4510 is performed until a pressure of the treating space reaches the target pressure. When the pressure of the treating space reaches the target pressure (critical pressure), the control unit 4900 stops supplying the supercritical fluid through the first injection line 4510 and supplies the supercritical fluid through the second injection line 4520. The supercritical fluid supplied through the second injection line 4520 is sprayed onto a central region of a top part of the substrate through the supply hole 4532 of the cover plate 4530, and a space between the cover plate 4530 and the treating surface of the substrate S is filled with the supercritical fluid. In this way, it is possible to prevent the supercritical fluid from liquefying and falling onto the substrate S by supplying the supercritical fluid from the first injection line 4510 prior to the second injection line 4520.

Figure 12:
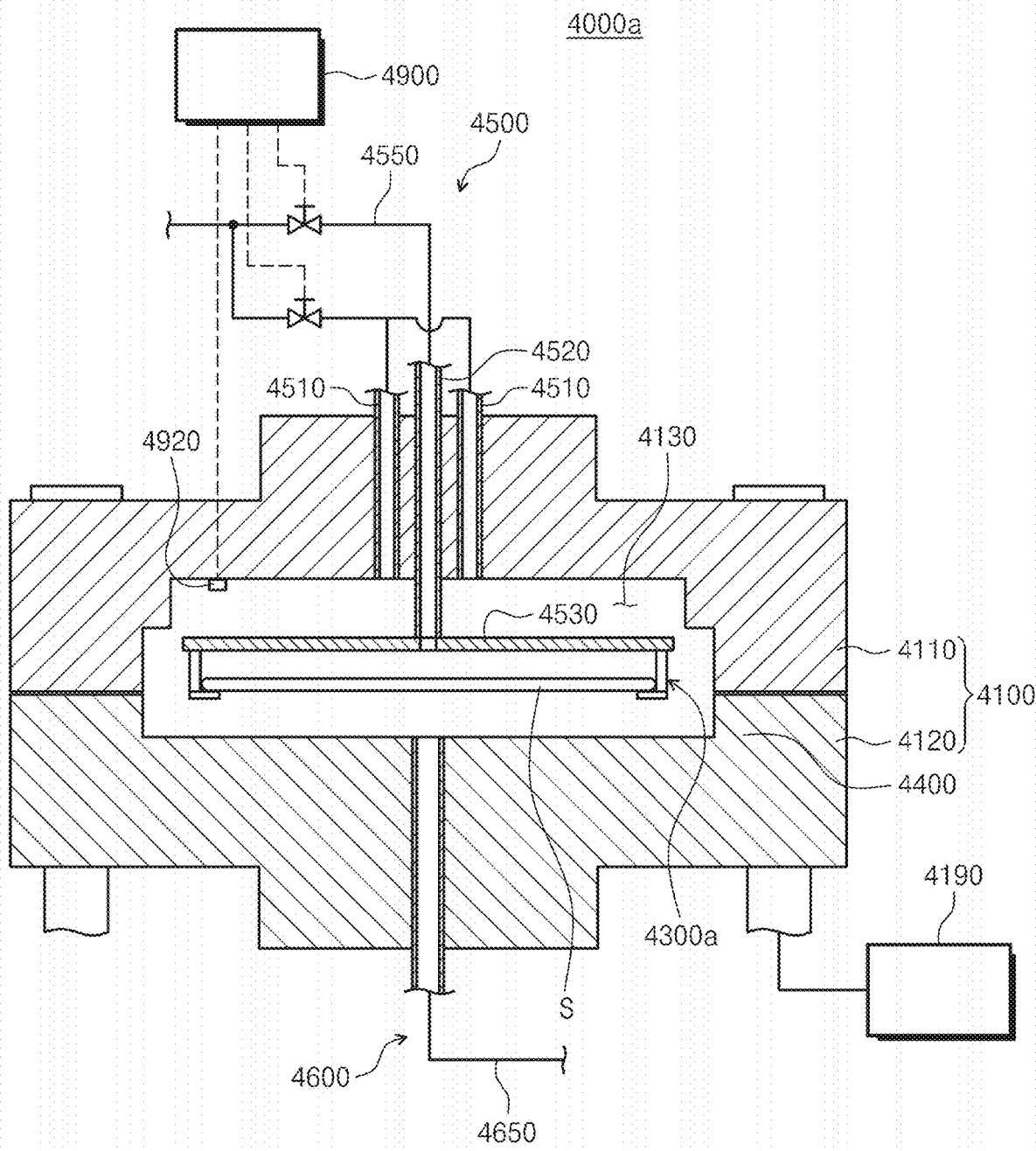
FIG. 12 illustrates a modified embodiment of the second process chamber.

FIG. 12 is a modified example of the second process chamber of FIG. 5.

Referring to FIG. 12, the second process chamber 4000 according to a modified embodiment includes a housing 4100, a support member 4300a, a heating member 4400, a fluid supply unit 4500, and a fluid exhaust unit 4600. These are provided with a configuration and function generally similar to those of the second process chamber illustrated in FIG. 5, and thus the differences from this embodiment will be mainly described of the modified embodiment.

In the modified embodiment, the support member 4300a may be installed at the cover plate 4530 to support the substrate S. In this case, the support member 4300a may be in a form of hanging and supporting the substrate. The support member 4300a may extend vertically upwardly from a bottom surface of the cover plate 4530 and may be bent horizontally at a top end thereof. As another example, the support member 4300a may be provided in the form of a slot protruding from both sidewalls of the housing 4100.

The support member 4300a may support an edge region of the substrate S. For example, the support member 4300a may be provided in the shape of a plate with a hole smaller than an area of the substrate S in the same shape or similar to the substrate S therein. Alternatively, the support member 4300*a* may be provided in a slot type supporting only the edge region of the substrate S. For this type of support member 4300*a*, most areas of a top surface and a bottom surface of the substrate S seated on the support member 4300*a* are exposed. Accordingly, during the supercritical drying process in the second process chamber 4000, an entire area of the substrate S may be exposed to the supercritical fluid and dried.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
    a chamber configured to form a treating space for performing a supercritical treating process therein;
    a substrate support configured to support a substrate at the treating space;
    a fluid supply configured to supply a treating fluid to the treating space; and
    an exhaust configured to exhaust an atmosphere of the treating space,
    wherein the fluid supply comprises a cover plate, a first injection line, and a second injection line, the cover plate being opposite to a treating surface of a substrate supported by the substrate support, the cover plate having a supply hole for supplying the treating fluid to the treating surface, the first injection line and the second injection line being at a top surface of the chamber, the first injection line being at each side of the second injection line in across-sectional view, and
    wherein the first injection line is configured to supply the treating fluid toward a top surface of the cover plate, and the second injection line is configured to directly supply the treating fluid to the treating surface of the substrate through the supply hole.

2. The substrate treating apparatus of claim 1, wherein the cover plate has a radius similar to or larger than a radius of the substrate.

3. The substrate treating apparatus of claim 1, wherein the supply hole is opposite to a center of the treating surface.

4. The substrate treating apparatus of claim 1, further comprises-comprising:
    a controller configured to control the fluid supply
    to supply the treating fluid through the first injection line until a pressure of the treating space reaches a target pressure, and to supply the treating fluid through the second injection line after the pressure of the treating space reaches the target pressure.

5. The substrate treating apparatus of claim 1, wherein the first injection line is in a plurality and is positioned in a radial shape based on the second injection line.

6. A substrate treating apparatus comprising:
    a chamber configured to form a treating space for performing a supercritical treating process therein;
    a substrate support configured to support a substrate at the treating space;
    a fluid supply configured to supply a treating fluid to the treating space; and
    an exhaust configured to exhaust an atmosphere of the treating space, and wherein the fluid supply comprises:
        a first injection line and a second injection line provided at a top surface of the chamber, the first injection line being at each side of the second injection line in across-sectional view, and
        a cover plate positioned between the top surface of the chamber and the substrate support, configured to block the treating fluid supplied from the first injection line from being directly sprayed in onto a treating surface of the substrate, and having a supply hole connected to the second injection line to directly supply the treating fluid supplied from the second injection line to the treating surface of the substrate, and
    wherein the first injection line is configured to supply the treating fluid toward a top surface of the cover plate, and the second injection line is configured to directly supply the treating fluid to the treating surface of the substrate through the supply hole.

7. The substrate treating apparatus of claim 6 further comprising:
    a controller configured to control the fluid supply
    to supply the treating fluid through the first injection line until a pressure of the treating space reaches a target pressure, and to supply the treating fluid through the second injection line after the pressure of the treating space reaches the target pressure.

8. The substrate treating apparatus of claim 7, wherein the target pressure is a critical pressure of the treating fluid.

9. The substrate treating apparatus of claim 7, wherein a radius of the cover plate is similar to or larger than a radius of the substrate.

10. The substrate treating apparatus of claim 7, wherein the supply hole is opposite to a center of the treating surface.

11. A substrate treating apparatus comprising:
    a substrate support configured to support a substrate at a treating space of a chamber;
    a plate including a through hole therein and positioned opposite to a treating surface of the substrate; and
    a fluid supply configured to supply a treating fluid to the treating space, and
    wherein the fluid supply comprises a first injection line and a second injection line, the first injection line being at each side of the second injection line in a cross-sectional view,
    the first injection line is configured to supply the treating fluid to a top surface of the plate, and
    the second injection line is configured to supply the treating fluid to the treating surface of the substrate through the through hole of the plate.

12. The substrate treating apparatus of claim 11, further comprising:
    a controller configured to control the fluid supply,
    wherein the controller is configured to control the fluid supply to firstly supply the treating fluid through the first injection line to prevent the treating fluid from directly contacting the substrate at an initial injection section of the treating fluid.

13. The substrate treating apparatus of claim 12, wherein the fluid supply is configured to firstly supply the treating fluid to an edge direction of the substrate through the first injection line, and directly supply the treating fluid through the second injection line to a top surface of the substrate when a pressure of the treating space reaches a target pressure.

14. The substrate treating apparatus of claim 13, further comprising:
   a detector configured to detect a pressure of the treating space,
   wherein the controller is configured to control a supplying of the treating fluid from the first injection line and the second injection line according to a pressure value of the treating space received from the detector.

15. The substrate treating apparatus of claim 12, wherein the controller is configured to supply the treating fluid through the second injection line when an inner pressure of the treating space reaches a critical pressure.

* * * * *